United States Patent [19]
West

[11] Patent Number: 4,868,379
[45] Date of Patent: Sep. 19, 1989

[54] PHOTOVOLTAIC ARRAY WITH TWO-AXIS POWER MAXIMIZATION TRACKING

[75] Inventor: Rick West, Pismo Beach, Calif.

[73] Assignee: Utility Power Group, Chatsworth, Calif.

[21] Appl. No.: 209,010

[22] Filed: Jun. 20, 1988

[51] Int. Cl.[4] .............................................. G01J 1/20
[52] U.S. Cl. .................................. 250/203 R; 136/246
[58] Field of Search ........................ 250/203 R, 203 S; 126/425; 136/246

[56] References Cited

U.S. PATENT DOCUMENTS

| | | | |
|---|---|---|---|
| 4,223,214 | 9/1980 | Dorian et al. | 250/203 R |
| 4,320,288 | 3/1982 | Schlarlack | 250/203 R |
| 4,628,142 | 12/1986 | Hashizume | 136/246 |

FOREIGN PATENT DOCUMENTS

| | | | |
|---|---|---|---|
| 3005876 | 3/1981 | Fed. Rep. of Germany | 136/246 |
| 0040064 | 12/1986 | Japan | 136/246 |

*Primary Examiner*—David C. Nelms
*Assistant Examiner*—Eric Chatman
*Attorney, Agent, or Firm*—Daniel C. McKown

[57] ABSTRACT

A control system for maximizing the power supplied by an array of solar cells senses the current and voltage produced and multiplies these to determine the instantaneous power. The array is tilted slightly in a first direction and the effect on the instantaneous power is noted. If an increase in power was produced, a further movement in the same direction is executed; but if the first movement produced a reduction in power, a movement in the opposite direction is executed. The process continues until no increase in power is obtained in either direction. Thereafter, the same process is carried out with respect to a second axis of the solar array.

4 Claims, 2 Drawing Sheets

| S. DIRECTION OF MOTION DURING THE MOST RECENT INTERVAL | ΔP EFFECT OF THE MOST RECENT MOTION ON P | S DESIRED DIRECTION OF MOTION IN THE NEXT INTERVAL | EFFECT |
|---|---|---|---|
| 1 = N (or E) | 1 (INCR.) | 1 = N (or E) | CONTINUE |
| 1 = N (or E) | 0 (DECR.) | 0 = S (or W) | REVERSE |
| 0 = S (or W) | 1 (INCR.) | 0 = S (or W) | CONTINUE |
| 0 = S (or W) | 0 (DECR.) | 1 = N (or E) | REVERSE |

PHOTOVOLTAIC ARRAY WITH TWO-AXIS POWER MAXIMIZATION TRACKING

BACKGROUND OF THE INVENTION

1. Field of the Invention

The present invention is in the field of solar energy and specifically relates to a control system for maximizing the power output of a solar array by altering the direction in which it is pointing, to compensate for movement of the sun, and other factors affecting total insolation

2. The Prior Art

A first group of patents make use of an open loop pointing system, in which the array is pointed to a direction at which the sun should be at a particular time. These patents include: U.S. Pat. No. 4,546,756 to Leroy, et al., U.S. Pat. No. 4,536,897 to Erickson, et al.; U.S. Pat. No. 4,440,150 to Kaehler; and, U.S. Pat. No. 4,215,410 to Weslow, et al.

A second group of patents show seekers of various designs that, typically, are mounted on the array and that include their own detectors.

In U.S. Pat. No. 4,352,350 Johnson shows a piston in a cylinder that is driven one way or the other depending on which side of the center the focus falls on.

In U.S. Pat. No. 4,564,275, Stone shows a control system for a heliostat. A digital image radiometer observes the target illuminated by the sun beam reflected from the heliostat mirror to determine whether the beam is centered or whether there is a pointing error. Having determined the error, the system corrects it.

In U.S. Pat. No. 4,287,411 Benucci shows a seeker that uses four photocells to provide error signals in two angular dimensions.

As shown in FIGS. 5 and 6 of U.S. Pat. No. 4,267,441, Monk shows a receiving means which consists of a narrow slit to pass light into a housing in which are located two detector cells. This is essentially a pin-hole camera. There is a small inactive strip between the cells of the differential detector.

In U.S. Pat. No. 4,225,781, Hammons shows a solar tracking apparatus that is mounted on the array as shown in his FIGS. 1-3.

In U.S. Pat. No. 4,187,123, Diggs uses an array of four thermocouples which normally lie in the shadow of member 71 shown in FIG. 8.

In U.S. Pat. No. 4,146,784, Yekutieli uses a novel type of seeker shown in his FIGS. 2a and 2b to provide steering information.

In U.S. Pat. No. 4,107,521, Winders shows a seeker in which a shaded light sensor is used. The sensor is a light-activated SCR.

In U.S. Pat. No. 4,649,899, Moore uses three elongated shadow boxes as a seeker, in the manner shown in his FIG. 2.

In U.S. Pat. No. 3,699,324, liff, et al. show a tracking system that points the boresight to a computed future position, and then allows the source to drift through the conical tracking beam.

The above-described patents describe seekers that perform best when attempting to locate bright point sources against a dark background. Their performance is difficult to analyze and not always reliable when called upon to track extended sources or to distinguish sources from a bright background.

The above patents typically employ seekers that are mounted on or adjacent the solar panel and the seeker includes its own detector. As will be seen below, the present invention does not employ a separate seeker or additional detectors. Instead, the solar panel itself is used as the detector.

None of the above patents addresses the problem of maximizing the power output of the solar array.

As will be seen below, the system of the present invention overcomes these problems of the prior art systems and maximizes the output of the solar array by the use of a simple and effective control system.

SUMMARY OF THE INVENTION

It is an objective of the present invention to provide a control system for a solar array that maximizes the power generated.

It is a further objective to provide a pointing control system for the array that maximizes the power generated regardless of the brightness distribution of the sky. That is, the control system of the present invention does not require a point source of radiation or even a small hot spot, but instead maximizes the power generated in response to all of the radiation falling on the array.

Another objective of the present invention is to provide a pointing system for a solar array in which the array itself is used as the radiation detector, and no additional seeker is used.

A further objective of the present invention is to provide a system that determines the two dimensional orientation of the array that maximizes the power.

Still a further objective of the invention is to provide a pointing control system that maximizes the power produced even where the possibility of adjacent array shadowing exists.

These objectives are met in accordance with the g present invention by continuously sensing the current and voltage supplied by the array and by continuously calculating the instantaneous electrical power produced by the array. Slight alterations are then intentionally made in the orientation of the array and the effect of these small intentional variations on the output power is determined. If the direction of a particular variation is found to increase the output power, continued movement in that direction is called for. On the other hand, if a particular variation results in a decrease in the output power, the direction of movement is reversed.

In one embodiment of the present invention, the array is mounted for motion in a north-south direction and for motion in an east-west direction. In that embodiment, the variation in the north-south position is made and evaluated until an optimum north-south position has been reached. Next, a series of variations in the east-west direction are made and their effects determined to permit the east-west position yielding maximum power to be determined.

Thus, the power maximization is carried out in a two-dimensional space, the dimensions being the north-south position, and the east-west position of the array. The power is first maximized in one direction and then in the other direction, in each cycle of operation.

Since the position of the sun, the position of the cloud cover, and shadowing vary throughout the day, the entire cycle of power maximization is carried out repeatedly through the day.

In accordance with a preferred embodiment of the present invention, the continuously calculated output power is applied to a sample-and-hold circuit periodically, and successive held values of the output power are compared to the continuously calculated output power to determine whether the output power is increasing or decreasing. A logic circuit then determines the direction of movement for the next sampling interval.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

Figure 1:
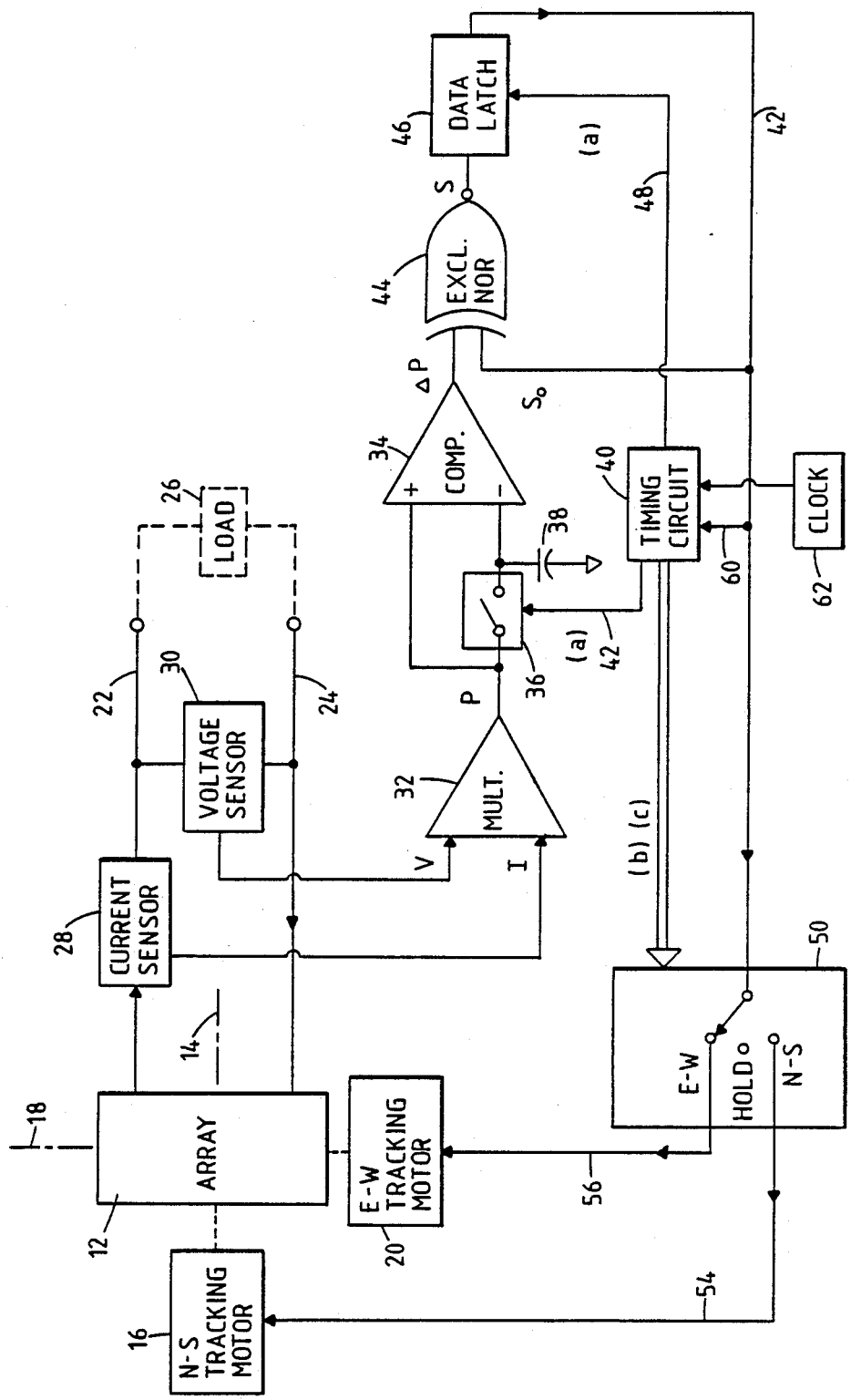
FIG. 1 is a system block diagram of a preferred embodiment of the present invention.

In the preferred embodiment, the array 12 of solar cells includes a flat plate on which the solar cells are mounted. The flat plate is mounted in a gimbal or similar structure that permits the array to pivot about a north-south axis 14 when driven by the north-south tracking 14 motor 16, and to pivot about the east-west axis 18 when driven by the east-west tracking motor 20. The array 12 drives current through the lines 22, 24 through the load 26.

A current sensor 28 senses the current supplied to the load 26, and a voltage sensor 30 senses the voltage across the lines 22, 24. The sensed current and voltage are multiplied in the multiplier 32 to produce a signal that represents the instantaneous power being furnished by the array to the load 26.

The signal representing the instantaneous power is applied to a combined sample-and-hold circuit and a g comparator 34. The sample-and-hold circuit includes the sampling switch 36 and the holding capacitor 38.

Figures 2, 3:
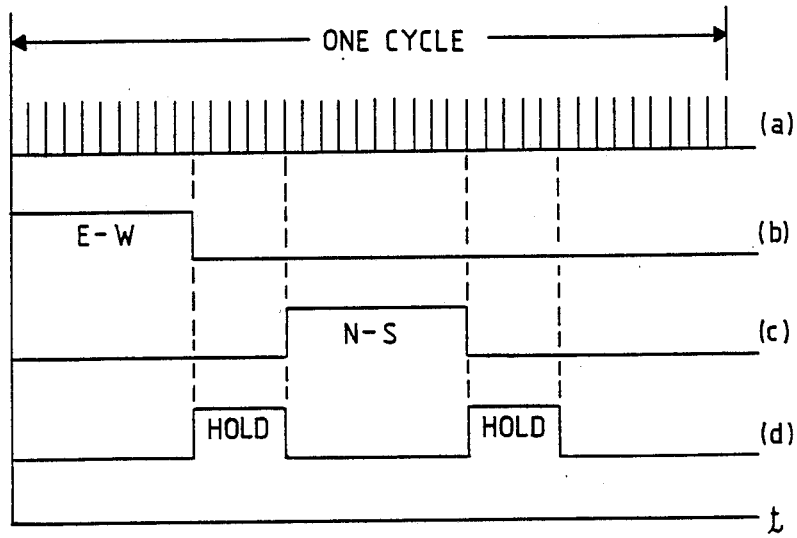
FIG. 2 is a truth table defining the operation of the logic circuit in a preferred embodiment; and, FIG. 3 is a graph showing how certain signals generated within the timing circuit vary with respect to time.

Graph (a) of FIG. 3 shows a sequence of timing pulses produced by the timing circuit 40 and applied to the sampling switch 36 on the line 42. The sampling switch 36 closes momentarily in response to each of the sampling pulses, thereby applying the instantaneous power signal to the holding capacitor 38, which continues to hold that value of power after the sampling switch opens. With the sampling switch 36 open again, the incoming instantaneous values of the power are applied to the positive input of the comparator 34, while the most-recently-sampled value is applied to the negative input of the comparator. The output of the comparator is a logic "1" or a logic "0" depending on which input of the comparator is the larger. Thus, the output of the comparator 34 is a 1 if the power increases during a sampling interval and is a 0 if the power decreases during a sampling interval.

The data latch 42 determines the sense of the rotation of the N-S tracking motor 16 and the E-W tracking motor 20 by maintaining a logic "1" on the line 42 when motion in the north or the east directions is to be made, and by maintaining a logic "0" on the line 42 when motion in the south or west directions is to be effected. During any particular sampling interval, the motion commanded by the data latch 46 is maintained, but a new command may be latched in during the next sampling interval. The successive commands maintained by the data latch 46 are determined by the exclusive NOR gate 44, which implements the truth table of FIG. 2 in the preferred embodiment.

The truth table of FIG. 2 reflects the algorithm by which the maximization is achieved. If the direction of motion during the most recent interval has resulted in an increase in the power, then that motion is continued in the next interval; but if the direction of motion in the most recent interval has brought about a decrease in the power, then that motion is reversed in the next interval. The clock 62 provides the basis on which the timing signals provided by the timing circuit 40 are generated. In the preferred embodiment the clock supplies timing pulses at the sampling frequency to the timing circuit 40, although the clock could actually operate at some multiple of the sampling frequency. The pulse train shown in graph (a) of FIG. 3 is supplied by the timing circuit 40 to the data latch 46 on the line 48. The timing circuit 40 also applies the signals shown in the graphs (b), and (c) of FIG. 3 to the demultiplexer 50 via the lines 52, to program the operation of the demultiplexer 50 to control the application of the logic signals on the line 42 to the lines 54, and 56.

As is apparent by comparing graphs (b) and (c), the power is maximized with respect to both variables, but these maximizations are carried out one at a time in a spaced sequence. First, the array is adjusted about the E-W axis until a position yielding maximum power is found. Next, the array is pivoted about the N-S axis until a maximum power is attained, and while leaving the E-W axis undisturbed. Thereafter, an inactive interval completes the basic cycle of operation. In practice, the inactive interval at the end of the cycle may be relatively long, since the variables are changing relatively slowly. For example, it is necessary to reorient the array in the E-W direction only every few minutes, and likewise for the N-S movement. These motions of the array compensate for movement of the sun, movement of clouds, movement of the sun relative to clouds, and shadows falling on the array. During the inactive positioning intervals, in a preferred embodiment, other variables affecting output power, such as the electrical operating point of the array are optimized for maximum power operation by adjusting the load by a similar iterative procedure.

The logic signals on the line 42 are fed to the timing circuit 40 via the line 60 to permit the timing circuit to determine when the maximization with respect to a particular variable has been completed. This decision is made on the basis that two successive transitions on the line 42 indicate that neither adjustments in the positive sense nor in the negative sense produce increases in power, and therefore the maximization must be complete. Thus, although the pulses shown in graphs (b) and (c) begin at the same location within each cycle, the ends of these pulses may vary from cycle to cycle.

Although a single array 12, driven by a single N-S tracking motor 16 and a single E-W tracking motor 20 has been shown for purposes of description, it is possible in other embodiments to slave, in series or parallel, a number of other arrays to the array 12, to the extent that the arrays are electrically identical. It is possible for the arrays to orient themselves to relieve the effect of the shadowing of adjacent arrays, such as typically occurs at dawn and dusk.

In another embodiment, if the calculated instantaneous power exceeds a predetermined maximum, such as might occur when random parabolic cloud reflections occur on cold high-insolation days, a pre-regulation circuit disables the maximum-seeking portion of the present system so as to deliberately prevent the array from pointing in the direction of maximum power. When the instantaneous power falls below a second predetermined level, the control system is again activated.

Thus, there has been described a solar array pointing control system that maximizes the instantaneous power produced by the array. The system uses the array itself as the detector of radiation, and its operation requires no lenses, mirrors, or other optics. The power is maximized regardless of the brightness distribution in the sky. In addition to maximizing the power produced, the system of the present invention minimizes the effect of shadowing by adjacent arrays such as typically occur at dawn and dust. The present invention also simplifies start-up and shut-down, and permits a degree of pre-regulation.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A method for orienting an array so that it supplies a maximum amount of power to a load, the array being mounted for pivotal motion about a first axis and a second axis, said method comprising the steps of:
   (a) pivoting the array about the first axis to whichever position yields the most power while keeping fixed the position about the second axis; then,
   (b) pivoting the array about the second axis to whichever position yields the most power while keeping fixed the position about the first axis.

2. A method for orienting an array so that it supplies a maximum amount of power to a load, the array being mounted for pivotal motion about an axis, said method comprising the steps of:
   (a) determining continuously the instantaneous power being delivered by the array to the load;
   (b) pivoting the array in a first sense about the axis for a brief interval of time;
   (c) determining whether the instantaneous power increased or decreased during the brief interval of time; and,
   (d) continuing the pivoting of the array in a first sense if the instantaneous power increased, and reversing the sense of the pivoting if the instantaneous power decreased.

3. The method of claim 3 further comprising the subsequent step of repeating steps c) and d) until the second of two successive reversals has occurred.

4. A method for orienting an array to maximize the amount of power supplied by the array to a load, the array being mounted for pivotal motion about a first axis and a second axis, said method comprising the steps of:
   (a) determining continuously the instantaneous power being delivered by the array to the load;
   (b) pivoting the array in a first sense about the first axis for a brief interval of time, while keeping fixed the position of the array with respect to the second axis;
   (c) determining whether the instantaneous power increased or decreased during the brief interval of time;
   (d) continuing the pivoting of the array in the next brief interval of time in the first sense if the instantaneous power increased, and reversing the sense of the pivoting in the next brief interval of time if the instantaneous power decreased, while keeping fixed the position of the array with respect to the second axis;
   (e) repeating steps (c) and (d) until the second of two successive reversals has occurred;
   (f) pivoting the array in a first sense about the second axis for a brief interval of time, while keeping fixed the position of the array with respect to the first axis;
   (g) determining whether the instantaneous power increased or decreased during the brief interval of time;
   (h) continuing the pivoting of the array in the next brief interval of time in the first sense if the instantaneous power increased, and reversing the sense of pivoting in the next brief interval of time if the instantaneous power decreased, while keeping fixed the position of the array with respect to the first axis; and,
   (i) repeating steps (g) and (h) until the second of two successive reversals has occurred.

* * * * *